United States Patent
Poulsen (10) Patent No.: US 11,652,471 B2
(45) Date of Patent: May 16, 2023

(54) LOW POWER BIQUAD SYSTEMS AND METHODS

(71) Applicant: Google LLC, Mountain View, CA (US)

(72) Inventor: Jens Kristian Poulsen, Kitchener (CA)

(73) Assignee: Google LLC, Mountain View, CA (US)

( * ) Notice: Subject to any disclaimer, the term of this patent is extended or adjusted under 35 U.S.C. 154(b) by 209 days.

(21) Appl. No.: 16/917,694

(22) Filed: Jun. 30, 2020

(65) Prior Publication Data
US 2021/0409004 A1    Dec. 30, 2021

(51) Int. Cl.
*H03H 17/00*     (2006.01)
*H03H 17/02*     (2006.01)

(52) U.S. Cl.
CPC ................ *H03H 17/0248* (2013.01)

(58) Field of Classification Search
CPC .................................. H03H 17/0348
See application file for complete search history.

(56) References Cited

U.S. PATENT DOCUMENTS 5,170,369 A    12/1992   Rossum
2005/0076073 A1*   4/2005   Gurrapu ............... G06F 7/5443
                                                                   708/300

FOREIGN PATENT DOCUMENTS

EP    0935342 A2    8/1999
GB    2455806 A    6/2009

OTHER PUBLICATIONS

Dattorro. The Implementation of Recursive Digital Filters for High-Fidelity Audio. Nov. 1, 1988. Journal of the Audio Engineering Society, Audio Engineering Society, New York, NY, US, pp. 851-878.
International Search Report and Written Opinion for International Application No. PCT/US2021/039608 dated Oct. 27, 2021. 22 pages.

* cited by examiner

*Primary Examiner* — Dinh T Le
(74) *Attorney, Agent, or Firm* — Kilpatrick Townsend & Stockton LLP (57) ABSTRACT

Biquad stage systems and methods include receiving at biquad sections a signal sample, generating, by each biquad section, a pair of output values based on the signal sample, including a first value based on fixed-point processing path and a second value emulating a floating-point processing path, and accumulating the pair of output values from each of the plurality of biquad sections to generate an output signal. The biquad stage receives an N-bit input signal, which is processed by a biquad section. Delay elements delay the signal sample before input to other biquad sections. The delayed signal sample is input to the first processing path and the second processing path of a corresponding biquad stage. By performing the processing based on two paths, a more accurate result can be found when using a reduced word length in the multiply operations resulting in a lowering of the power consumption.

17 Claims, 9 Drawing Sheets

| Bit | B23-B6 | B5 | B4 | B3 | B2 | B1 | B0 |
|---|---|---|---|---|---|---|---|
| Function | 18 bits coefficient multiplier | Shifting function (see, e.g., FIG. 3C) | | | Extra addition function (see, e.g., FIG. 3B) | | |

FIG. 3B (340)

| B2 | B1 | B0 | ALU Operation | Extra operation Audio X {-2, -1, 0, +1, +2} |
|---|---|---|---|---|
| 0 | 0 | 0 | No addition (default) | 0 |
| 0 | 0 | 1 | No addition | 0 |
| 0 | 1 | 0 | No addition | 0 |
| 0 | 1 | 1 | No addition | 0 |
| 1 | 0 | 0 | ADD 1 X audio sample | 1 |
| 1 | 0 | 1 | SUB 1 X audio sample | -1 |
| 1 | 1 | 0 | ADD 2 X audio sample | 2 |
| 1 | 1 | 1 | SUB 2 X audio sample | -2 |

FIG. 3C (360)

| Value | Shifting of multiplication products | | |
|---|---|---|---|
| | B5 | B4 | B3 |
| 0 | 0 | 0 | 0 |
| 1 | 16 | 8 | 4 |

FIG. 4

Low Pass

| Coef | Shift | Multiply | Add ACC | Add sample | Instruction |
|---|---|---|---|---|---|
| $b_0$ | 4x {0-7} | 24x24 | 64 bits | ---- | ACC = shifter(B0' x sample) + ACC |
| $b_1$ | 4x {0-7} | 24x24 | 64 bits | ---- | ACC = shifter(B1' x sample) + ACC |
| $b_2$ | 4x {0-7} | 24x24 | 64 bits | ---- | ACC = shifter(B2' x sample) + ACC |
| $a_1$ | 4x {0-7} | 24x24 | 64 bits | 25 bits | ACC = shifter(A1' x sample) + ACC - 2x sample |
| $a_2$ | 4x {0-7} | 24x24 | 64 bits | 24 bits | ACC = shifter(A2' x sample) + ACC + sample |

FIG. 5A

High Pass

| Coef | Shift | Multiply | Add ACC | Add sample | Instruction |
|---|---|---|---|---|---|
| $b_0$ | 4x {0-7} | 24x24 | 64 bits | 24 bits | ACC = shifter(B0' x sample) + ACC - sample |
| $b_1$ | 4x {0-7} | 24x24 | 64 bits | 25 bits | ACC = shifter(B1' x sample) + ACC + 2x sample |
| $b_2$ | 4x {0-7} | 24x24 | 64 bits | 24 bits | ACC = shifter(B2' x sample) + ACC - sample |
| $a_1$ | 4x {0-7} | 24x24 | 64 bits | 25 bits | ACC = shifter(A1' x sample) + ACC - 2x sample |
| $a_2$ | 4x {0-7} | 24x24 | 64 bits | 24 bits | ACC = shifter(A2' x sample) + ACC + sample |

FIG. 5B

All Pass

| Coef | Shift | Multiply | Add ACC | Add sample | Instruction |
|---|---|---|---|---|---|
| $b_0$ | 4x {0-7} | 24x24 | 64 bits | 24 bits | ACC = shifter(A2' x sample) + ACC - sample |
| $b_1$ | 4x {0-7} | 24x24 | 64 bits | 25 bits | ACC = shifter(B1' x sample) + ACC + 2x sample |
| $b_2$ | 4x {0-7} | 24x24 | 64 bits | 24 bits | ACC = shifter(B2' x sample) + ACC |
| $a_1$ | 4x {0-7} | 24x24 | 64 bits | 25 bits | ACC = shifter(A1' x sample) + ACC - 2x sample |
| $a_2$ | 4x {0-7} | 24x24 | 64 bits | 24 bits | ACC = shifter(A2' x sample) + ACC + sample |

LOW POWER BIQUAD SYSTEMS AND METHODS

TECHNICAL FIELD

The present disclosure relates generally to systems and methods for digital signal processing and more particularly, for example, to improved digital biquadratic (biquad) stages.

BACKGROUND

When evaluating the response of high-order IIR filters, it is common practice to transform the filter components into a series of second order sections, often referred to as biquads. The use of second-order biquad sections, along with first order sections as necessary, may reduce coefficient sensitivity and optimize dynamic range. However, when evaluating these second order biquad sections, multiple errors related to the finite length of the binary words used to represent the coefficients and internal states may be encountered. Problems with biquad implementations include calculation noise, DC-toggling effect, and problems with implementing a low cutoff frequency and using a high sampling frequency at the same time. In view of the foregoing, there is a continued need for improved systems and methods for evaluating low power IIR filters.

SUMMARY

In accordance with various embodiments, improved systems and methods for evaluating impulse infinite response filters comprising second order biquad sections are disclosed. The disclosed embodiments reduce and/or eliminate errors related to the finite length of the binary words used to represent the coefficients and internal states, including reduction/elimination of calculation noise, DC-toggling effect and problems often encountered when implementing a low cutoff frequency and using a high sampling frequency at the same time.

Embodiments disclosed herein provide an improved scaling of the binary coefficients in biquad stage including a hybrid of floating point and fixed-point arithmetic with the advantages of both and by the recognition that the coefficients normally encountered for lowpass, highpass and allpass sections are located close to the values $\{-2, -1, 0, 1, 2\}$. In various embodiments, the precision of the implemented filter is improved significantly at a low computational cost, by adding an offset of these values $\{-2, -1, \ldots\}$ to the basic coefficient. As a result, the coefficient needed to store will be close to zero and can be represented with low binary precision and a shifting operation. This approach provides a precision better than single precision floating point arithmetic, and sometimes even better than double precision arithmetic, while at the same time having a power consumption that is only marginally larger than fixed point arithmetic using short coefficient words.

The scope of the present disclosure is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, wherein showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

In accordance with various embodiments, improved systems and methods for evaluating impulse infinite response filters comprising second order biquad sections are disclosed.

In various embodiments, systems and methods for evaluating an IIR filter include transforming the filter into a series of second-order biquad sections to reduce coefficient sensitivity and requirements for dynamic range. The disclosed embodiments reduce and/or eliminate errors related to the finite length of the binary words used to represent the coefficients and internal states, including reduction/elimination of calculation noise, DC-toggling effects and problems often encountered when implementing a low cutoff frequency and using a high sampling frequency at the same time. In conventional systems, implementations in a single precision floating point format may solve some of these problems, but other problems will remain, such as problems with low cutoff frequencies that require more bits of precision, requiring long fixed-point operations or double precision floating point arithmetic.

The present disclosure addresses these and other problems by a combination of improved scaling of the binary coefficients in embodiments including a hybrid of floating point and fixed-point arithmetic with the advantages of both and by the recognition that the coefficients normally encountered for lowpass, highpass and allpass sections are located close to the values $\{-2, -1, 0, 1, 2\}$.

In various embodiments, the precision of the implemented filter is improved significantly at a low computational cost, by adding an offset of these values $\{-2, -1, 0, 1, 2\}$ to the basic coefficient. As a result, the coefficient needed to be stored will be close to zero and can be represented with low binary precision and a shifting operation. This approach provides a precision better than single precision floating point arithmetic, and sometimes even better than double precision floating point arithmetic, while at the same time having a power consumption that is only marginally larger than fixed point arithmetic using short coefficient words.

Embodiments of the present disclosure will now be described in greater detail with reference to the figures. The embodiments disclosed herein provide many advantages over conventional systems, including lower power consumption and lower complexity as compared to floating point and long coefficient word fixed point approaches, and the possibility of handling a very wide range of filtering requirements with a relatively low complexity overhead.

Figure 1:
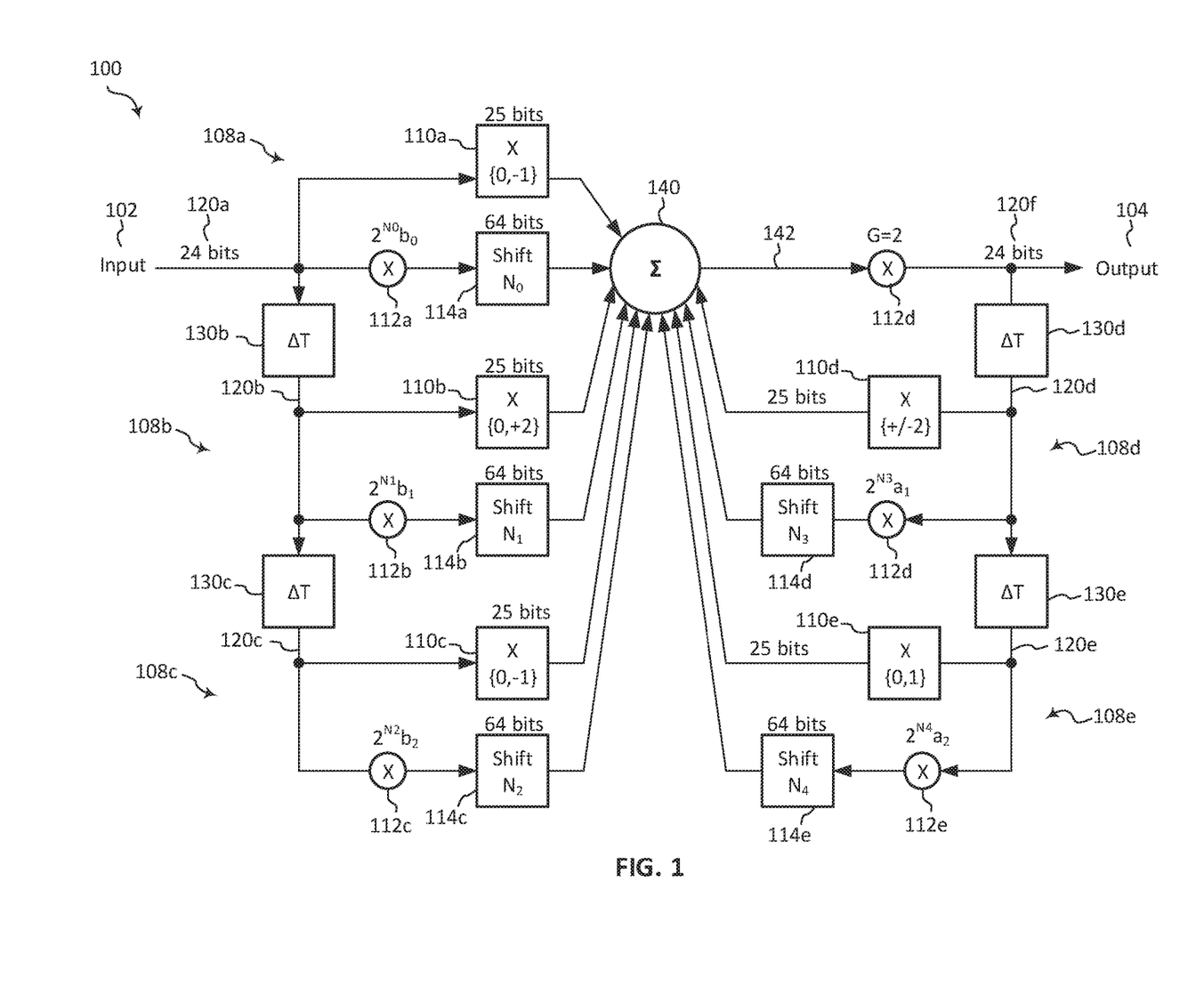
FIG. 1 is an example of low-power high precision biquad stage, in accordance with one or more embodiments.

Referring to FIG. 1, embodiments of low-power, high-precision biquad evaluation systems and methods will now be described. The various embodiments disclosed herein may be implemented in hardware or software/firmware, which may include use of an extension to existing fixed point instruction sets thereby requiring minimal changes to existing designs.

As illustrated, a biquad stage 100 is implemented with a modified process for updating internal nodes. In a conventional biquad stage, nodes are updated according to the general equation sum=sum+sample×coefficient, for coefficients a1, a2, b0, b1, and b2 in the transfer function:

$$H(z) = \frac{b_0 + b_1 z^{-1} + b_2 z^{-2}}{1 + a_1 z^{-1} + a_2 z^{-2}}$$

In the illustrated embodiment, the modified biquad stage updates nodes using the equation sum=sum+sample×{-2, -1, 0, 1, 2}+$2^{-N}$×(sample×modified coefficient). The modified coefficient will be close to zero and by using a suitable factor of $2^{-N}$, it is possible to store the coefficients using a short signed short binary word. This will enable an accurate filter evaluation even though a short multiplication coefficient is used. It should be noticed, that the multiplication by {-2, -1, 0, 1, 2} may be performed using a simple shifting operation. Furthermore, the shift by $2^{-N}$ may not need to be performed using a full barrel shifter since a limited precision in the fractional part will be sufficient since the coefficient is now very small. By doing this, we can obtain a high dynamic range without needing to resort to very long word lengths during the multiplication operation and only the addition operation will need a long word length. Thus, in FIG. 1 is shown an example of using 24×24 bits multiplications and 64 bits additions. Since the multiplication operations are vastly more expensive than an addition, considerable power can be saved. If we had used 48×48 bits operation for the multiply, the power consumption would be approximately four times higher. Thus, by properly scaling the coefficients, it is possible to obtain significant power savings.

One could also view the solution as using a Taylor series for the evaluation of the biquad coefficients—these will consist of a constant term and a series expansion. Since the constant term is located very close to the values {-2, -1, 0, 1, 2} (as given by standard equations for biquad filter coefficients), we can form the product of sample values times these coefficients by two terms—the constant times the sample and a shifted version of the coefficient times the sample and then shift the product to its proper position. This way, we both avoid the need for floating point arithmetic and the need for long word lengths in the multiplication operation, while still obtaining high dynamic range. One could also say, that the second part using an upshifting and downshifting during the operations is emulating a floating point multiplication operation without all of the associated hardware overhead, because the shifts are known beforehand so we do not need to keep track of the value of a mantissa and we may directly combine the output value with a long addition to the first value to obtain superior precision with low power consumption.

As an example, assume we have a coefficient of the value 1.975. This can be represented as a constant of +2 (obtained in the first path using a simple shift operation) and 0.025 in the second path. Now, we can represent 0.025 as 0.025= (0.025×32)/32 to obtain a number that is close to, but smaller than one (it is assumed the multiplier will handle inputs in the range between plus and minus one). We will then form the product of 0.8 (=0.025×32) or an approximation thereof and the input samples in the multiplier and afterwards divide the result by 32 before adding this to the first part. That way, we can use a much smaller number of bits, if the coefficients happens to be located close to certain values such as {-2, -1, 0, 1, 2} which happens for IIR audio filter coefficients. This is especially important for low filter cutoff frequencies, where the second part may be very small and in this case the upshifting and downshifting before and after forming the product effectively emulates a high precision floating point operation without the associated hardware. This means we don't need to keep track of mantissa values or perform arbitrary shifting operations where it is required to search for the most significant bit during every addition or subtraction but can still obtain a very high accuracy.

In some embodiments, the biquad stage is evaluated on a digital signal processor and implemented through instructions such as:

ACC=ACC+Audio_sample×{-2,-1,0,+1,+2}+ bit_shifted(Audio_sample(23 . . . 0)×Coefficient (23 . . . 6))

In the illustrated embodiment, an input 102 to the biquad stage 100 receives an input signal sample 120a (e.g., a 24-bit sample or other N-bit sample), such as a discrete time sample of an audio input signal. The input signal sample 120a is fed to a first biquad section 108a including a first processing path having a multiplier 110a, which is configured to multiply the input signal sample 120a by 0 or -1, depending on the biquad stage 100 configuration. The first path may be implemented using a multiplexer that will select between the complementary (-X) and zero (0) as the input values to perform a multiplication by {-1, 0}. The first biquad section 108a also includes a second processing path, having a multiplier 112a, which is configured to multiply the input signal 120a by a coefficient $2^{N0}b_0$ and a bit shifter 114a. The 25-bit output of multiplier 110a and 64-bit output from bit shifter 114a are added together by the accumulator 140. This way, we avoid using a 48×48 or 64×64 bits multiply operation, while maintaining a high accuracy. It should be noted that the coefficient used in the multiplication 112 is corrected for the fact that we have two paths and that one path is being multiplied by $2^{-N0}$ in 114a after the product is being formed in 112a.

The input signal sample 120a is also provided to a delay element 130b, to produce a delayed signal sample 120b, which is delayed by one sample, and provided to a second biquad section 108b, including a first path including a multiplier 110b, which is configured to multiply the delayed signal sample 120b by 0 or +2 (typically implemented using a multiplexer), depending on the biquad stage 100 configuration. The second biquad section 108b also includes a second processing path, having a multiplier 112b, which is configured to multiply the delayed signal sample 120b by a coefficient $2^{N1}b_1$ and a bit shifter 114b. The 25-bit output of multiplier 110b and 64-bit output from bit shifter 114b are added to the output of other biquad sections by the accumulator 140.

The delayed signal sample 120b is also provided to a delay element 130c, to produce a delayed signal sample 120c, which is delayed by two samples, and provided to a third biquad section 108c, including a first path including a multiplier 110c, which is configured to multiply the delayed signal sample 120c by 0 or −1, depending on the biquad stage 100 configuration. The third biquad section 108c also includes a second processing path, having a multiplier 112c, which is configured to multiply the delayed signal sample 120c by a coefficient $2^{N2}b_2$ and a bit shifter 114c. The 25-bit output of multiplier 110c and 64-bit output from bit shifter 114c are added to the output of other biquad sections by the accumulator 140.

The accumulator 140 generates an accumulated signal 142 as a sum of received outputs from feedforward biquad sections 108a-c and feedback biquad section 108d-e, and which is processed through a multiplier 112d to generate an output signal 120f provided to an output 104.

The biquad stage 100 further includes feedback sections 108d-3 that process the output signal 120f for input to the accumulator 140. A delay element 130d delays the output signal 120f by one sample to generate a delayed output signal 120d, which is processed by a fourth biquad section 108d through a first processing path having multiplier 110d configured to multiply the delayed output signal 120d by −2 or +2, and second processing path, having a multiplier 112d, which is configured to multiply the delayed output signal 120d by a coefficient $2^{N3}a_1$ and a bit shifter 114d. The 25-bit output of multiplier 110d and 64-bit output from bit shifter 114d are added to the output of other biquad sections by the accumulator 140.

A delay element 130e receives the delayed output signal 120d and outputs a delayed output signal 120e to generate a delayed output signal 120d, which is delayed by two samples. The delayed output signal 120e is processed by a fifth biquad section 108e through a first processing path having multiplier 110e configured to multiply the delayed output signal 120d by 0 or 1, and second processing path having a multiplier 112e, which is configured to multiply the delayed output signal 120e by a coefficient $2^{N4}a_4$ and a bit shifter 114e. The 25-bit output of multiplier 110e and 64-bit output from bit shifter 114e are added to the output of other biquad sections by the accumulator 140.

It will be appreciated by those having ordinary skill in the art that FIG. 1 illustrates an example implementation of aspects of the present disclosure and modifications to the illustrated embodiment, including processing signals having different bit-lengths than illustrated and biquad stage 100 having different configurations in accordance with the teachings of the present disclosure.

Figure 2:
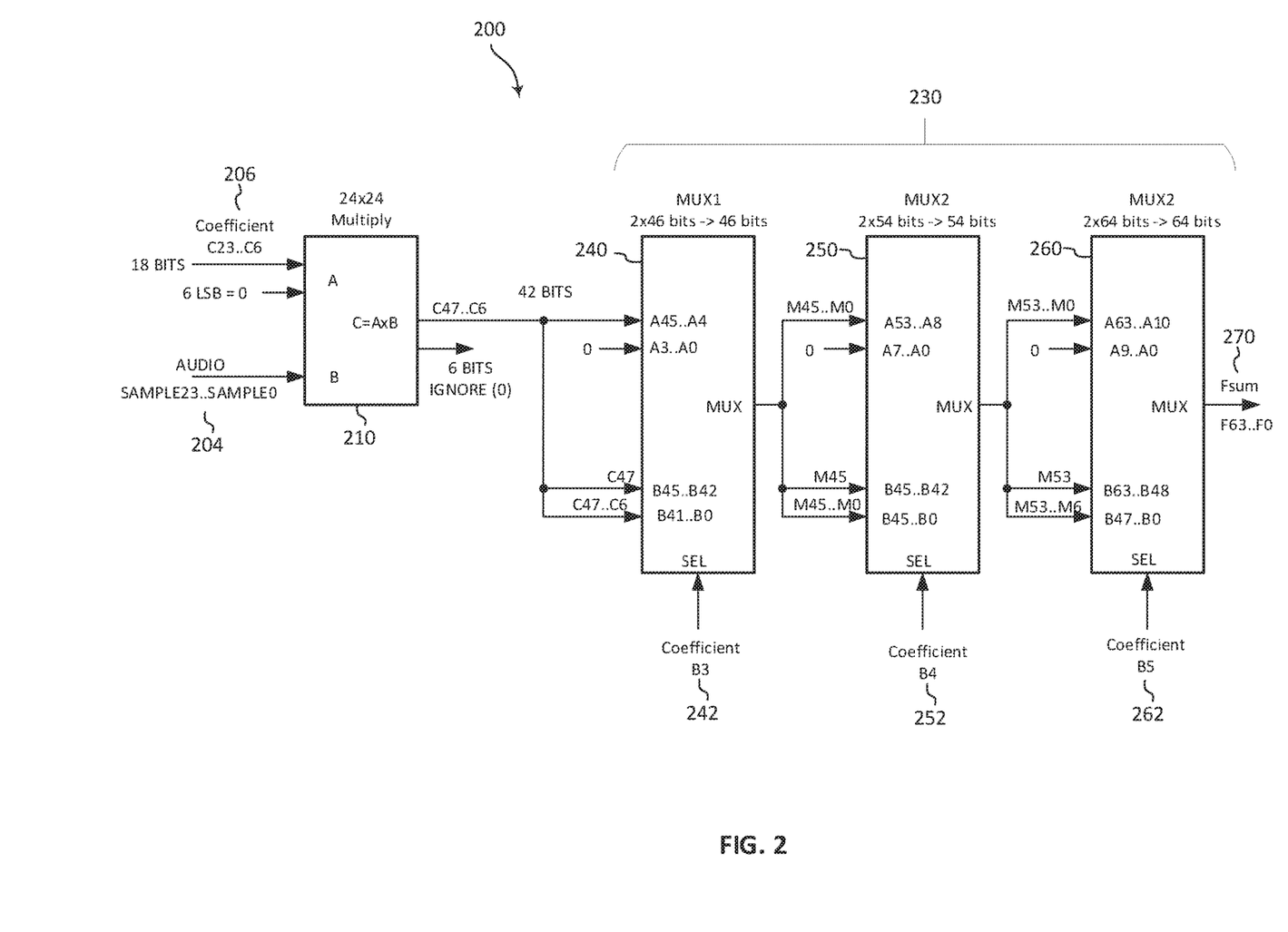
FIG. 2 is an example multiplier and bit-shifting circuit, in accordance with one or more embodiments.

Referring to FIG. 2, an example combination multiplier and bit-shifting circuit will now be described in accordance with one or more embodiments. In some embodiments, the multiplier and bit-shifting circuit 200 may implement the multipliers 112a-e and bit-shifters 114a-e illustrated in FIG. 1. As illustrated, the number of bit shifts is determined by coefficient field (e.g., coefficients 242, 252 and 262). When bits are shifted to the right (e.g., divide by two), the circuit 200 is configured to copy the most significant bit (MSB) to ensure the correct sign is maintained.

As illustrated, a 24-bit audio sample 204 (B) is provided to a multiplier 210, along with coefficients 206 (A). The product C=A×B is processed to generate a 48-bit output. Bit shifting components 230 in the illustrated embodiment include a first multiplexer 240, second multiplexer 250 and a third multiplexer 262, to produce a 64-bit output sample 270 (Fsum).

Figure 3A:
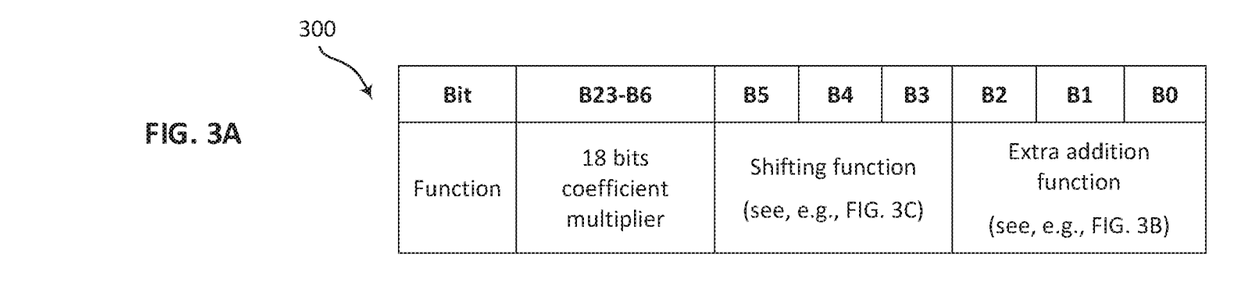
FIGS. 3A, 3B and 3C are tables illustrating example operations for using the circuit of FIG. 2, in accordance with one or more embodiments.

Referring to FIG. 3A, a table 300 defining a coefficient word that may be used in the embodiments of FIGS. 1 and 2 is illustrated. An example of special operations defined by bits B2, B1 and B0 are illustrated in in the table 340 of FIG. 3B, and shifting coefficients are illustrated in the table 360 of FIG. 3C. In one embodiment, the operation X {−2, −1, 0, +1, +2} will be determined by the Coefficient bits field (2 . . . 0). Bits B23-B6 hold an 18-bit coefficient multiplier, such as coefficient 206 of FIG. 2. In various embodiments, the operations may be performed by an arithmetic logic unit (ALU) or other processing unit.

Figure 3B:
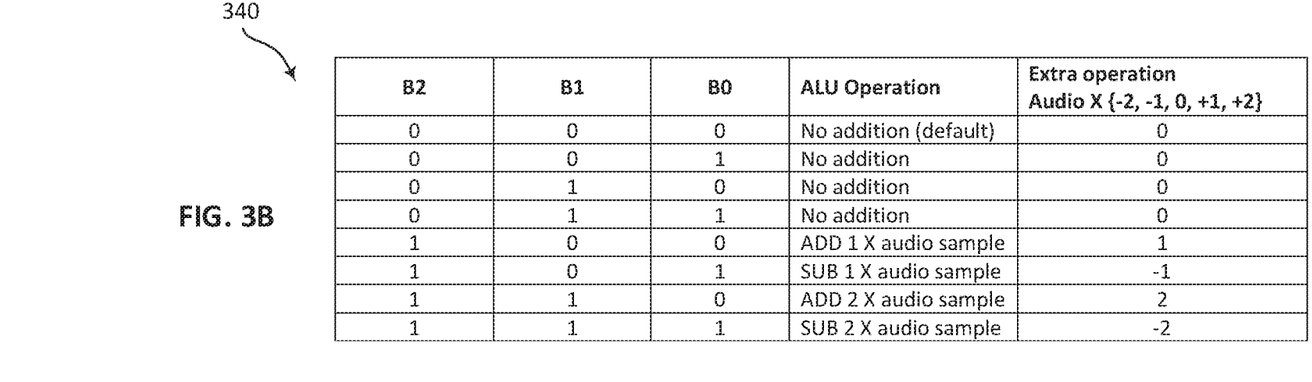
Figure 3C:
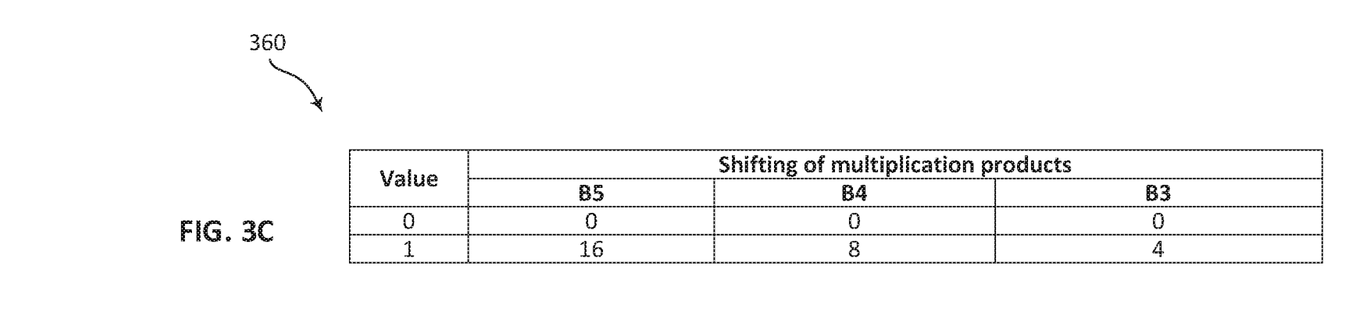
Figure 4:
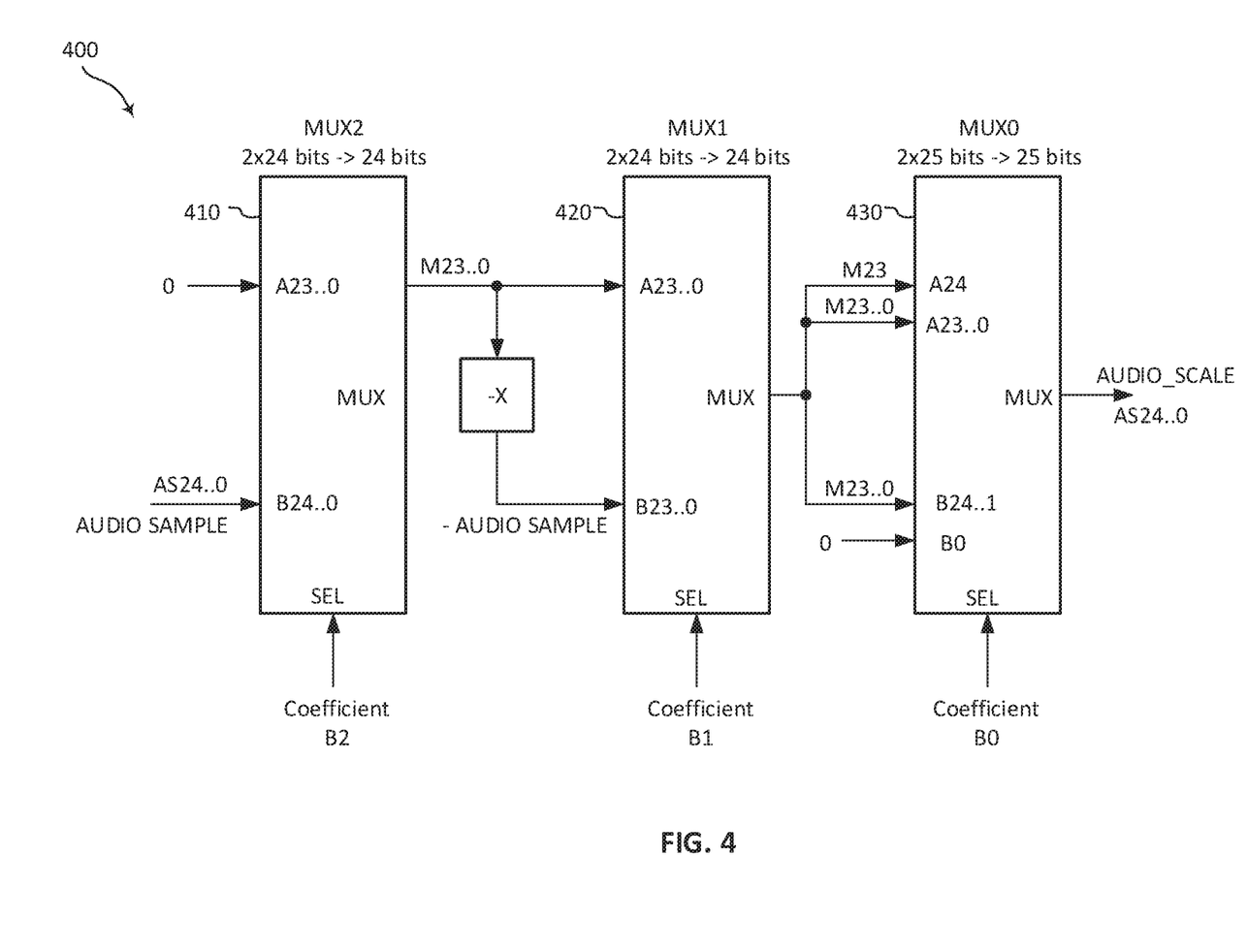
FIG. 4 is an example multiplier and bit-shifting circuit, in accordance with one or more embodiments.
Figure 5A:
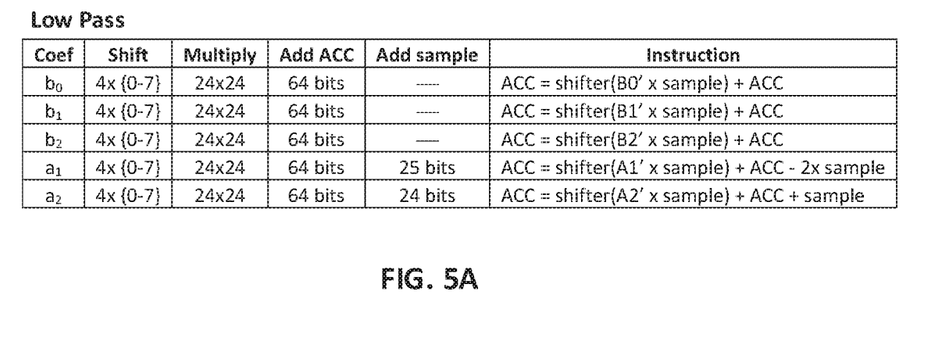
FIGS. 5A, 5B, and 5C are tables illustrating example operations for using the circuit of FIG. 4, in accordance with one or more embodiments.
Figure 5B:
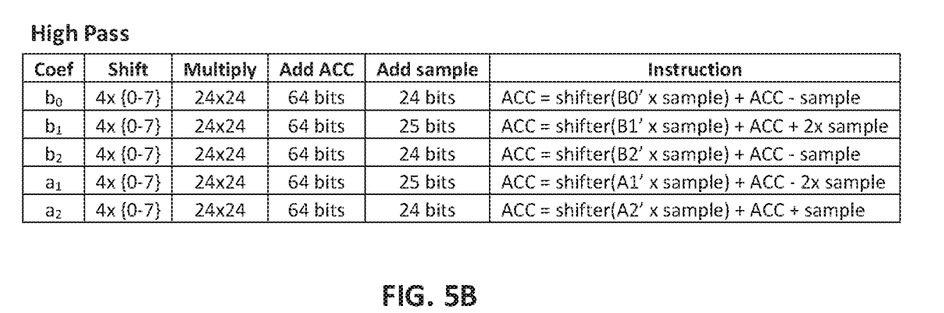
Figure 5C:
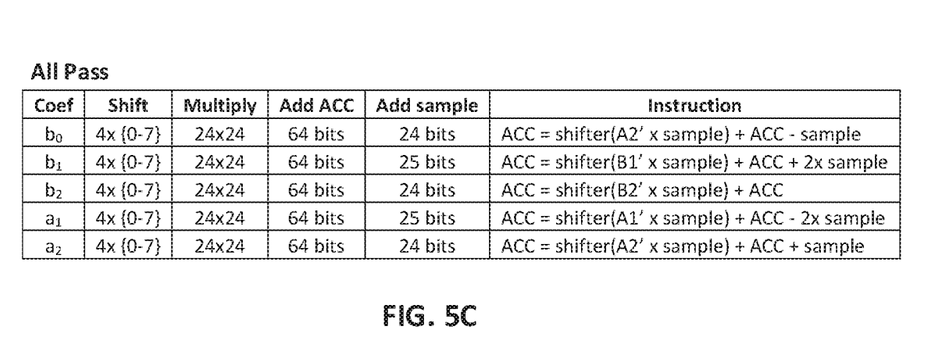

FIG. 4 illustrates an example multiplier and bit-shifting circuit 400 to obtain a sample x {−2, −1, 0, 1, 2}, and FIGS. 5A, 5B, and 5C are tables illustrating example operations for using the circuit of FIG. 4, in accordance with one or more embodiments. The multiplier and bit-shifting circuit 400 may be used to implement the multiplier components 110a-e of FIG. 1, for example. As illustrated, the multiplier and bit-shifting circuit 400 includes a first multiplexer 410 (MUX2), a second multiplexer 420 (MUX1) and a third multiplexer 430 (MUX0), which are controlled by coefficients B2, B1 and B0, respectively. For example, the coefficients B2, B1 and B0 may operate as illustrated in FIG. 3B. In this example, only a few multiplexers are used (three), though a full barrel shifter could have been used instead using five multiplexers enabling shifts from 0 to 31 bits. The selection of the number of multiplexers and the shifts each multiplexer uses is a compromise between power consumption, accuracy and dynamic range requirements.

Examples of various configurations of the biquad stage 100 of FIGS. 1-4 will now be described in greater detail with respect to FIGS. 5A-C. In FIG. 5A, an example of a lowpass configuration is illustrated, in which transformed coefficients ($b_i$, $a_i$) and optimal shifts are calculated by a program. In FIG. 5B, an example of a highpass configuration is illustrated, in which transformed coefficients ($b_i$, $a_i$) and optimal shifts are calculated by a program. In FIG. 5C, an example allpass configuration is illustrated, in which transformed coefficients ($b_i$, $a_i$) and optimal shifts are calculated by a program.

Figure 6:
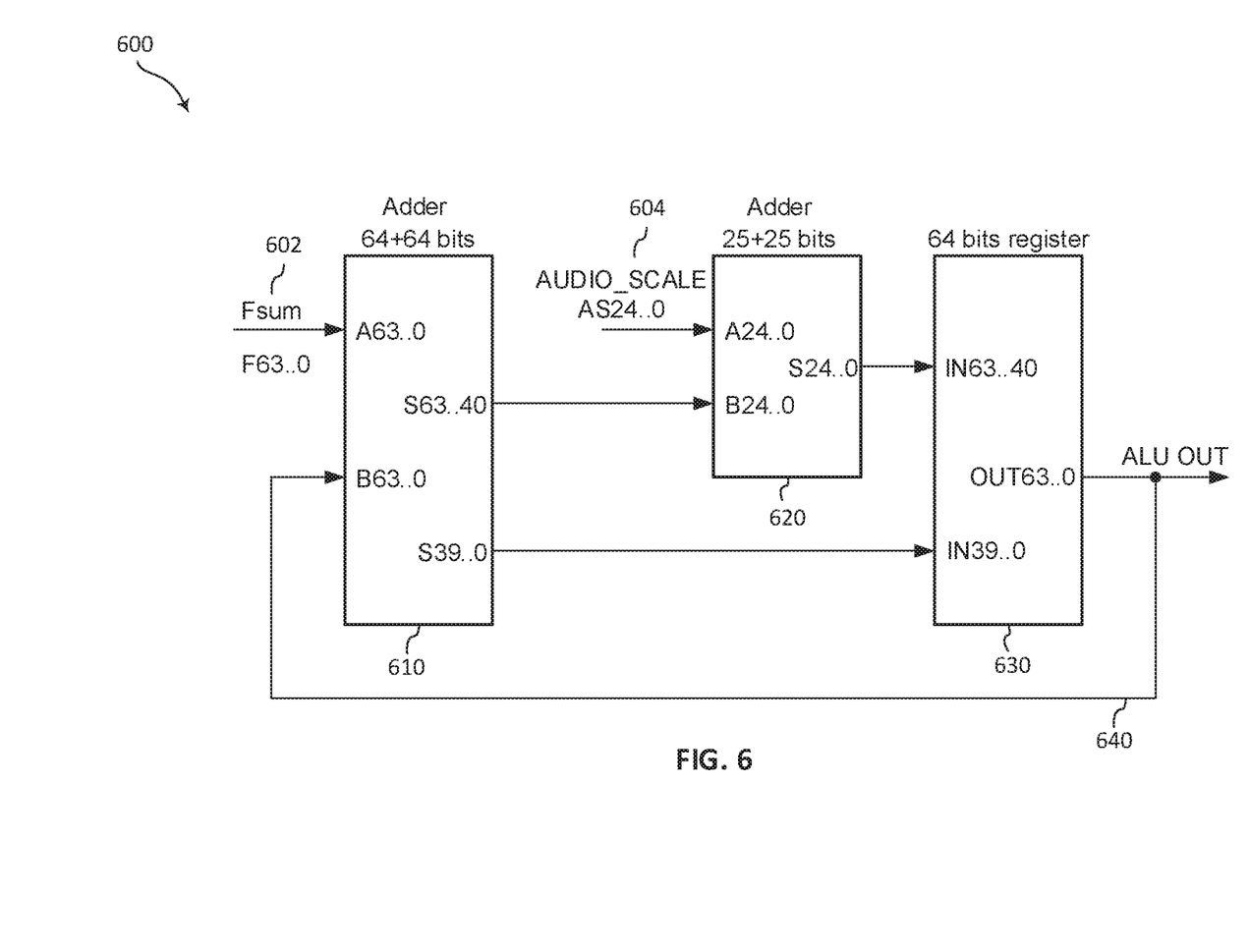
FIG. 6 is an example circuit illustrating a combination of constant plus coefficient times each sample at the main accumulator, in accordance with one or more embodiments.

Referring to FIG. 6, an example of an accumulator circuit 600 providing a combination of constant plus coefficient times each sample, will now be described in accordance with one or more embodiments. The accumulator circuit 600 may be used to implement the accumulator 140 of FIG. 1 and includes an adder 610 configured to add the received 64-bit sample values 602 (Fsum), an adder 620 configured to add the 25 bit sample values 604, and a 64-bit register 630 configured to generate the output value of the ALU and feedback the output value to the adder 610.

Figure 7:
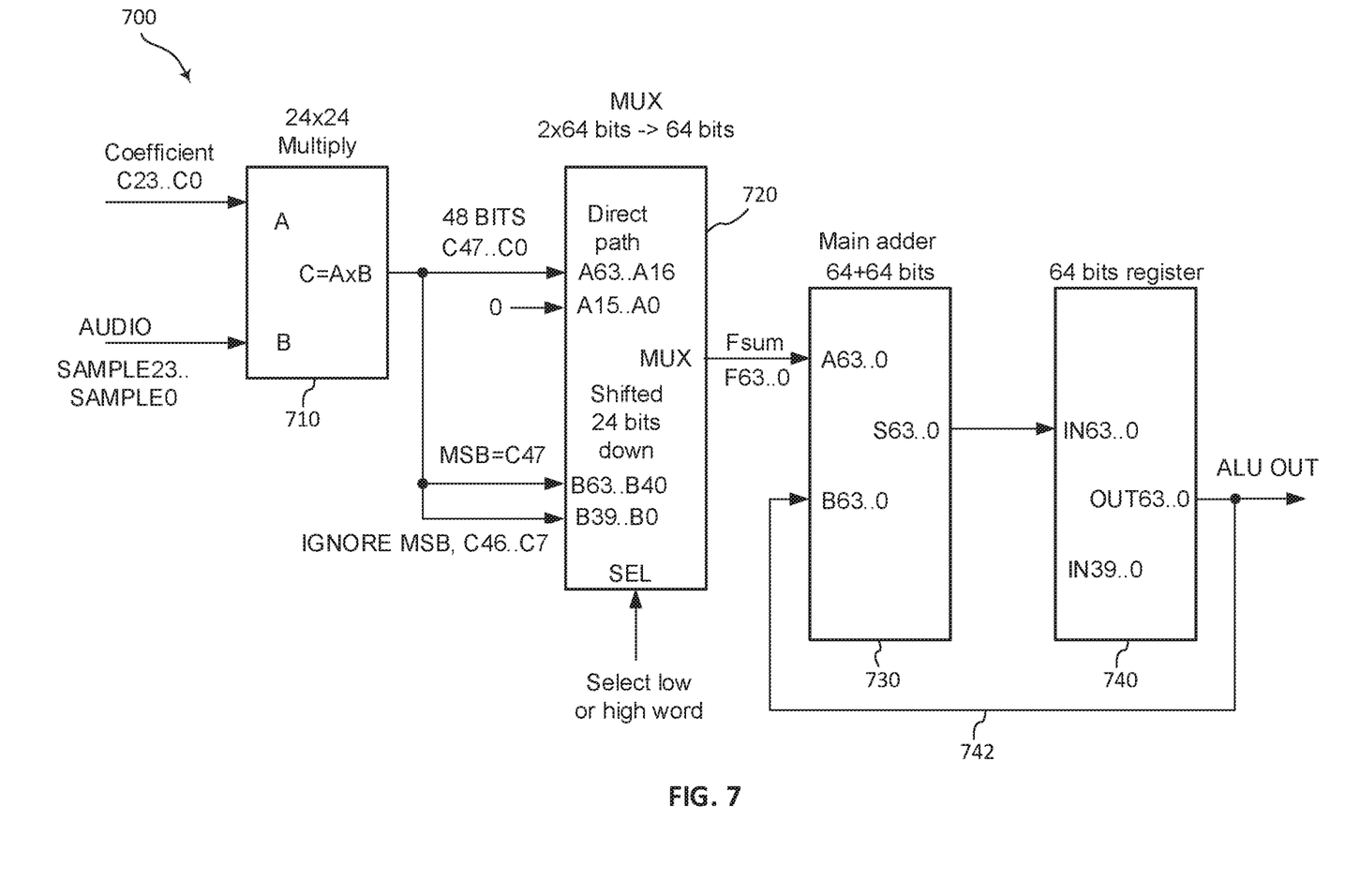
FIG. 7 illustrates and example implementation of extended precision integer multiplication for biquad evaluation, in accordance with one or more embodiments.

Referring to FIG. 7, an example circuit 700 implementing an extended precision integer multiply for accurate biquad evaluation will now be described in accordance with one or more embodiments. In some embodiments, it is possible to extend existing 24-bit coefficients to 48 bits by using existing MAC instructions instead of implementing a new instruction while using proper scaling and offset. This will have similar numerical benefits but includes an overhead of two instructions and may double the power consumption of the original solution.

In a simplified scheme, the following is evaluated:

ACC=ACC+signed_coefficient_48_bits*sample_24_bits

Figure 8:
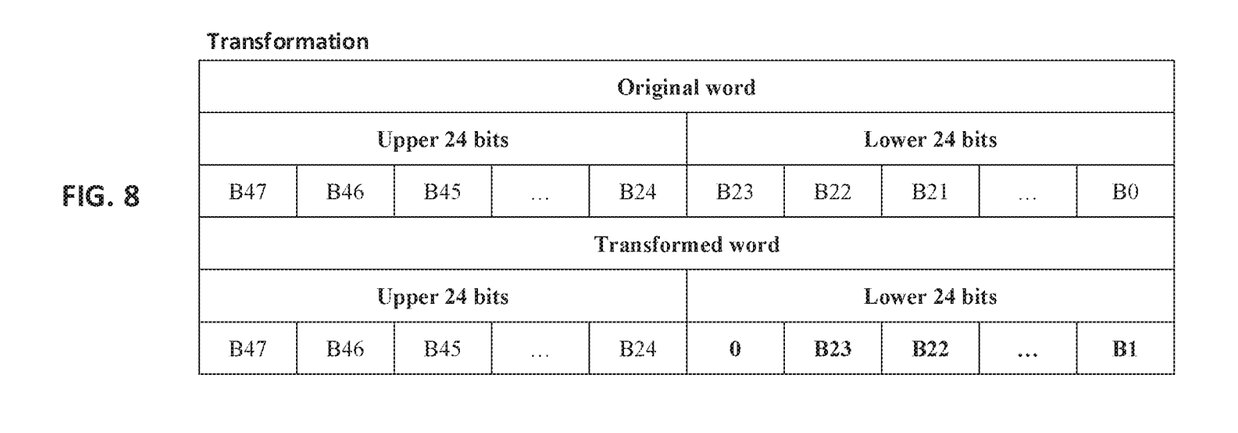
FIG. 8 is a table illustrating coefficient transformations for use with the implementation of FIG. 7, in accordance with one or more embodiments.

This may be implemented as follows (extending the signed multiply by inserting a zero, see table in FIG. 8):

ACC=ACC+signed_coefficient_24_upper_bits*sample_24_bits   1)

ACC=ACC+sign_shifted _24 bits{signed_coefficient _24_lower_bits*sample_24_bits}   2)

The circuit 700 includes a multiplier 710 receiving a 24-bit audio sample and coefficient, a multiplexer 720 generating the 64-bit Fsum output, a main adder 730 and a 64-bit register 740. The output of the ALU is fed back (742) to the main adder 730. The 48-bit coefficients may be first transformed, for example, in Matlab or other numerical processing platform, through a hardware implementation, or combination of hardware and firmware/software as needed for this step. In the transformation process, the least significant bit (LSB) is lost and the most significant bit (MSB) in the lower word is replaced by a zero. This ensures, that when the signed 24×24 multiplication is performed, the lower coefficient word will be interpreted as a true positive number. In various embodiments, this may be required to get correct results when using a signed multiplier.

Figure 9:
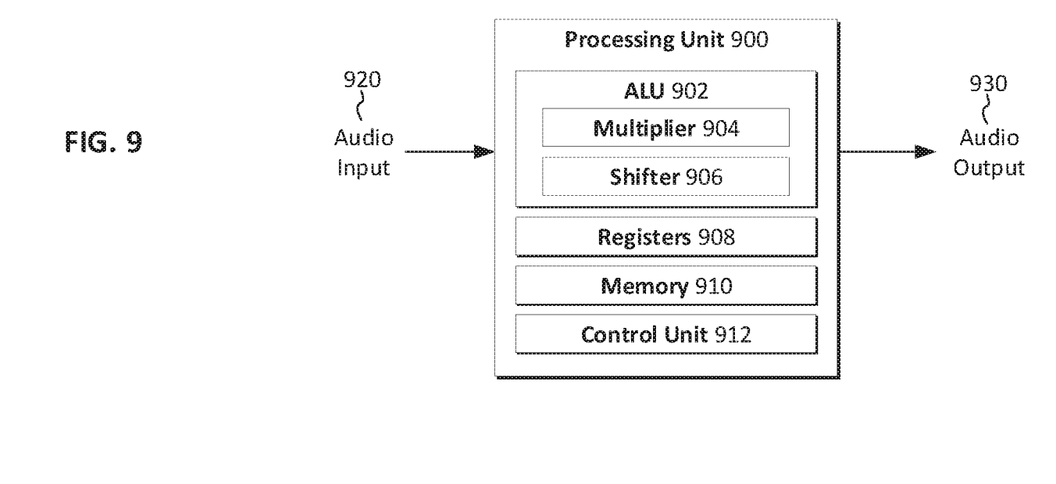
FIG. 9 illustrates an example processing unit, in accordance with one or more embodiments.

Referring to FIG. 9, an example processing unit 900 will now be described, in accordance with one or more embodiments. The processing unit 900 may be implemented in any digital signal processing system that includes a digital signal filter, with the filter including one or more biquad stages. In one example, the processing unit 900 is implemented in an audio processing system to filter an audio input signal 920 to generate a filtered audio output signal 930. In various embodiments, the biquad stages may be implemented in hardware, software or a combination of hardware and software.

The processing unit 900 is a logic device configured to implement one or more of the systems and methods disclosed therein, and may include an application specific processor, a digital signal processor, a central processing unit, or other processing component. In the illustrated embodiment, the processing unit 900 includes a control unit 912 and a memory 910, which may include instructions for execution by the control unit 912. The processing unit 900 further includes an arithmetic logic unit 902, including multiplier 904 and shifter 906 components (e.g. a barrel shifter), and registers 908.

Figure 10:
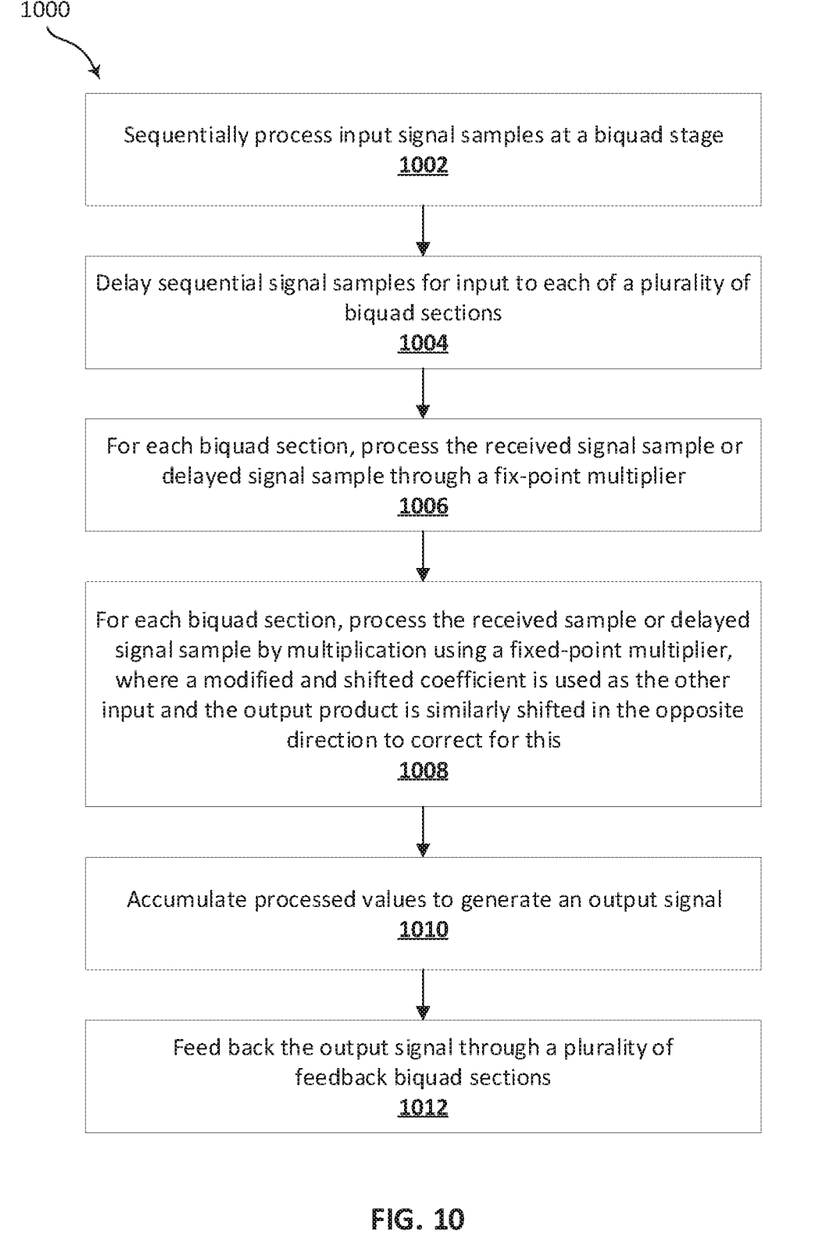
FIG. 10 is a flow chart illustrating an example process for operating a biquad stage, in accordance with one or more embodiments.

Referring to FIG. 10, a process for operating a biquad stage will now be described, in accordance with one or more embodiments of the present disclosure. A process 1000 may be implemented through hardware, software and/or a combination thereof. The process includes, at step 1002, sequentially processing input samples at a biquad stage, and delaying sequential signal samples for input to each of a plurality of biquad stages, at step 1004. In step 1006, for each biquad section, the received signal sample or delayed signal sample is processed through a fixed-point path. This may involve multiplying the value by a constant e.g. by using a shift operation. In step 1008, for each biquad section the received signal sample or delayed signal sample is processed by multiplying it by a shifted and modified coefficient and shifting the resulting product in the opposite direction, effectively emulating a floating-point operation without requiring much of the associated hardware. In step 1010, the processed output from steps 1006 and 1008 (and 1012, below) are accumulated by an accumulator to generate an output signal. In step 1012, the output signal is fed back through a plurality of feedback biquad sections.

Where applicable, various embodiments provided by the present disclosure may be implemented using hardware, software, or combinations of hardware and software. Also, where applicable, the various hardware components and/or logic components set forth herein may be combined into composite components comprising software, hardware, and/or both without departing from the scope of the present disclosure. Where applicable, the various hardware components and/or logic components set forth herein may be separated into sub-components comprising software, hardware, or both without departing from the scope of the present disclosure. In addition, where applicable, it is contemplated that software components may be implemented as hardware components and vice versa.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. For example, although the low delay decimators and low delay interpolators disclosed herein are described with reference to adaptive noise cancellation systems, it will be appreciated that the low delay filters disclosed herein may be used in other signal processing systems. Having thus described embodiments of the present disclosure, persons of ordinary skill in the art will recognize that changes may be made in form and detail without departing from the scope of the present disclosure. Thus, the present disclosure is limited only by the claims.

What is claimed is:
1. An infinite impulse response filter comprising:
a plurality of biquad sections, each biquad section configured to receive a signal sample and generate a pair of output values including:
a first path configured to process the signal sample based on fixed-point processing; and
a second path configured to process the signal sample based on changing a coefficient value by performing a first shift it in one direction and after forming a product, shift the product in the opposite direction so as to correct for the first shift;
a first plurality of delay elements configured to delay the signal sample, wherein:
the signal sample to a first biquad section of the plurality of biquad sections is not delayed;
the signal sample to a second biquad section of the plurality of biquad sections is delayed using a first delay element of the first plurality of delay elements; and
the signal sample to a third biquad section of the plurality of biquad sections is delayed using a second delay element of the first plurality of delay elements;
an accumulator configured to receive and sum the pair of output values from each of the plurality of biquad sections to generate an accumulated signal;
a plurality of feedback biquad sections, each feedback biquad section configured to receive an accumulated signal output by the accumulator and generate a pair of feedback output values including:
a first feedback path configured to process the accumulated signal based on fixed-point processing; and a second feedback path configured to process the accumulated signal based on changing a coefficient value by shifting it in one direction and after forming a product, shift the product in the opposite direction, wherein
   an output of each feedback path of each of the plurality of feedback biquad sections are input to the accumulator; and
a second plurality of delay elements configured to delay the accumulated signal, wherein:
   the accumulated signal to a first feedback biquad section of the plurality of feedback biquad sections is delayed using a first delay element of the second plurality of delay elements; and
   the accumulated signal to a second feedback biquad section of the plurality of feedback biquad sections is delayed using a second delay element of the second plurality of delay elements.

2. The infinite impulse response filter of claim 1, further configured to receive a sequence of N-bit input signal samples, which are processed by at least one of the plurality of biquad sections.

3. The infinite impulse response filter of claim 1, wherein each biquad section includes a corresponding filter coefficient.

4. The infinite impulse response filter of claim 1, wherein the first path is configured to multiply and shift the received signal sample.

5. The infinite impulse response filter of claim 1, wherein the first path comprises a multiplier component and a plurality of multiplexers configured to perform bit shifting operations.

6. The infinite impulse response filter of claim 1, wherein the second path comprises a plurality of multiplexers configured to perform operations in accordance with a plurality of coefficients.

7. The infinite impulse response filter of claim 6, wherein the coefficients are configurable to implement low pass, high pass and all pass filters.

8. The infinite impulse response filter of claim 1, wherein the accumulator comprises a first adder configured to sum the output values from the first path and a second adder configured to sum the output values from the second path.

9. The infinite impulse response filter of claim 8, wherein the accumulator further comprises a register configured to store and output the accumulated value, which is fed back into the first adder.

10. A method comprising:
receiving at a plurality of biquad sections a signal sample, wherein each biquad section of the plurality of biquad sections comprises:
   a first path configured to process the signal sample based on fixed-point processing; and
   a second path configured to process the signal sample based on changing a coefficient value by performing a first shift in one direction and after forming a product, shift the product in the opposite direction so as to correct for the first shift
delaying, by a first plurality of delay elements, the signal sample prior to a second biquad section and a third biquad section of the plurality of biquad sections, wherein:
   the signal sample to a first biquad section of the plurality of biquad sections is not delayed;
   the signal sample to the second biquad section is delayed using a first delay element of the first plurality of delay elements; and
   the signal sample to the third biquad section is delayed using a second delay element of the first plurality of delay elements; and
generating, by each biquad section, a pair of output values based on the signal sample using the first path and the second path; and
accumulating the pair of output values from each of the plurality of biquad sections to generate an output signal.

11. The method of claim 10, further comprising receiving an N-bit input signal, which is processed by at least one of the plurality of biquad sections.

12. The method of claim 10, further comprising configuring each biquad section using a corresponding filter coefficient.

13. The method of claim 10, wherein the plurality of biquad sections include forward paths receiving an input signal, and feedback paths receiving a processed output signal from an accumulator and/or a delayed processed output signal from the accumulator.

14. The method of claim 10, wherein the fixed-point processing is configured to multiply the signal sample by a constant using one or more multiplexers.

15. The method of claim 10, wherein a correction path comprises a coefficient that has been changed by shifting, an integer multiplier and a bit shifting of the product consisting of a plurality of multiplexers to compensate for the earlier change of the coefficient.

16. The method of claim 10, wherein a correction path comprises a plurality of multiplexers configured to perform operations in accordance with a plurality of coefficients, and wherein the coefficients are configurable for low pass, high pass and all pass filter implementations.

17. The method of claim 10, wherein an accumulator comprises a first adder configured to sum the output values from the first path and a second adder configured to sum the output values from the second path; and wherein the accumulator further comprises a register configured to store and output the accumulated value, which is fed back into the first adder.

* * * * *